US012673865B2

(12) United States Patent　　　(10) Patent No.: US 12,673,865 B2
Bretthauer et al.　　　(45) Date of Patent: Jul. 7, 2026

(54) MEMS DEVICE AND APPARATUS HAVING SUCH A MEMS DEVICE

(71) Applicant: Infineon Technologies AG, Neubiberg (DE)

(72) Inventors: Christian Bretthauer, Munich (DE); Marco Haubold, Dresden (DE); Hans-Jörg Timme, Ottobrunn (DE); Dominik Mayrhofer, Graz (AT)

(73) Assignee: Infineon Technologies AG, Neubiberg (DE)

( * ) Notice: Subject to any disclaimer, the term of this patent is extended or adjusted under 35 U.S.C. 154(b) by 294 days.

(21) Appl. No.: 18/334,468

(22) Filed: Jun. 14, 2023

(65) Prior Publication Data

US 2023/0406694 A1　　Dec. 21, 2023

(30) Foreign Application Priority Data

Jun. 17, 2022　　(EP) ..................................... 22179665

(51) Int. Cl.
B81B 3/00　　　　(2006.01)
H04R 19/02　　　(2006.01)

(52) U.S. Cl.
CPC ............ B81B 3/0021 (2013.01); B81B 3/007 (2013.01); H04R 19/02 (2013.01);
(Continued)

(58) Field of Classification Search
CPC ........ B81B 3/0021; B81B 3/007; H04R 19/02
See application file for complete search history.

(56) References Cited

U.S. PATENT DOCUMENTS

| 2017/0041708 A1 | 2/2017 | Barzen |
| 2017/0064450 A1 | 3/2017 | Kursula et al. |

(Continued)

FOREIGN PATENT DOCUMENTS

| DE | 102015210919 A1 * | 12/2016 | ........... B81B 3/0021 |
| WO | WO-2015119626 A1 * | 8/2015 | ............. H04R 19/02 |
| WO | 2019004933 A1 | 1/2019 | |

OTHER PUBLICATIONS

Dominik Mayrhofer et al., "A New Method for Sound Generation Based on Digital Sound Reconstruction" Journal of Theoretical and Computational Acoustics, vol. 29, No. 4, Dec. 27, 2021, 32 pages.

(Continued)

*Primary Examiner* — Carolyn R Edwards
*Assistant Examiner* — Dylan Maguire Neece
(74) *Attorney, Agent, or Firm* — Slater Matsil, LLP

(57) ABSTRACT

A MEMS device includes a substrate having a cavity and a membrane structure mechanically connected to the substrate and configured for deflecting out-of-plane with regard to a substrate plane and with a frequency in an ultrasonic frequency range to cause a fluid motion of the fluid in the cavity. The MEMS device includes a valve structure sandwiching the cavity together with the membrane structure, wherein the valve structure includes a planar perforated structure and a shutter structure opposing the perforated structure and arranged movably in-plane and with a frequency in the ultrasonic frequency range and with regard to the substrate plane and between a first position and a second position. The shutter structure is arranged to provide a first fluidic resistance for the fluid in the first position and a second, higher fluidic resistance for the fluid in the second position.

20 Claims, 14 Drawing Sheets

(52) U.S. Cl.
    CPC . *B81B 2201/0257* (2013.01); *B81B 2201/036*
        (2013.01); *B81B 2203/0127* (2013.01); *B81B*
        *2203/06* (2013.01); *H04R 2201/003* (2013.01)

(56) References Cited

U.S. PATENT DOCUMENTS

| 2017/0201192 | A1  | 7/2017  | Tumpold et al. |            |
|--------------|-----|---------|----------------|------------|
| 2019/0285196 | A1* | 9/2019  | Giusti         | B81C 1/0015 |
| 2020/0087138 | A1  | 3/2020  | Schenk et al.  |            |
| 2020/0319144 | A1  | 10/2020 | Manz et al.    |            |
| 2021/0040942 | A1  | 2/2021  | Seidl et al.   |            |
| 2021/0347634 | A1* | 11/2021 | Giusti         | H04R 7/04  |

OTHER PUBLICATIONS

D. Mayrhofer et al., "Investigation of a new method for sound generation—Advanced Digital Sound Reconstruction" Elektrotechnik & Informationstechnik, Mar. 25, 2021, 138/3, pp. 148-154.

* cited by examiner

120

MEMS DEVICE AND APPARATUS HAVING SUCH A MEMS DEVICE

This application claims the benefit of European Patent Application No. 22179665.9, filed on Jun. 17, 2022, which application is hereby incorporated herein by reference.

TECHNICAL FIELD

The present disclosure relates to a MEMS device and to an apparatus having such a MEMS device.

BACKGROUND

MEMS structures may be used for generating a pressure wave and/or a flow in a fluid, e.g., a gas. Such a MEMS device may comprise a moveable part interacting with the fluid, e.g., a membrane. Examples of such MEMS devices are pumps, loudspeakers, or microphones.

A MEMS device may comprise semiconductor materials, for example, on a basis of silicon, wherein electrical current may flow based on conductive materials such as metal materials and/or doping of a semiconductor material.

There is a need to enhance existing MEMS devices.

SUMMARY

According to an embodiment, a MEMS device comprises a substrate having a cavity and a membrane structure mechanically connected to the substrate and configured for deflecting out-of-plane with regard to a substrate plane and with a frequency in an ultrasonic frequency range to cause a fluid motion in the cavity. The MEMS device comprises a valve structure sandwiching the cavity together with the membrane structure. The valve structure comprises a planar perforated structure and a shutter structure opposing the perforated structure and arranged moveably in-plane with a frequency in the ultrasonic frequency range and with regard to the substrate plane and between a first position and a second position. The shutter structure is arranged to provide for a first fluidic resistance for the fluid motion in the first position and a second, higher, fluidic resistance for the fluid in the second position.

According to an embodiment, an apparatus comprises such a MEMS device and is a loudspeaker or a pump. Some embodiments of the present disclosure relate to a MEMS structure with a horizontal shutter and optional driving membrane for micro-speaker, valve and pumping applications.

BRIEF DESCRIPTION OF THE DRAWINGS

Preferred embodiments in accordance with the present disclosure are described herein while making reference to the accompanying drawings, in which.

Figure 1:
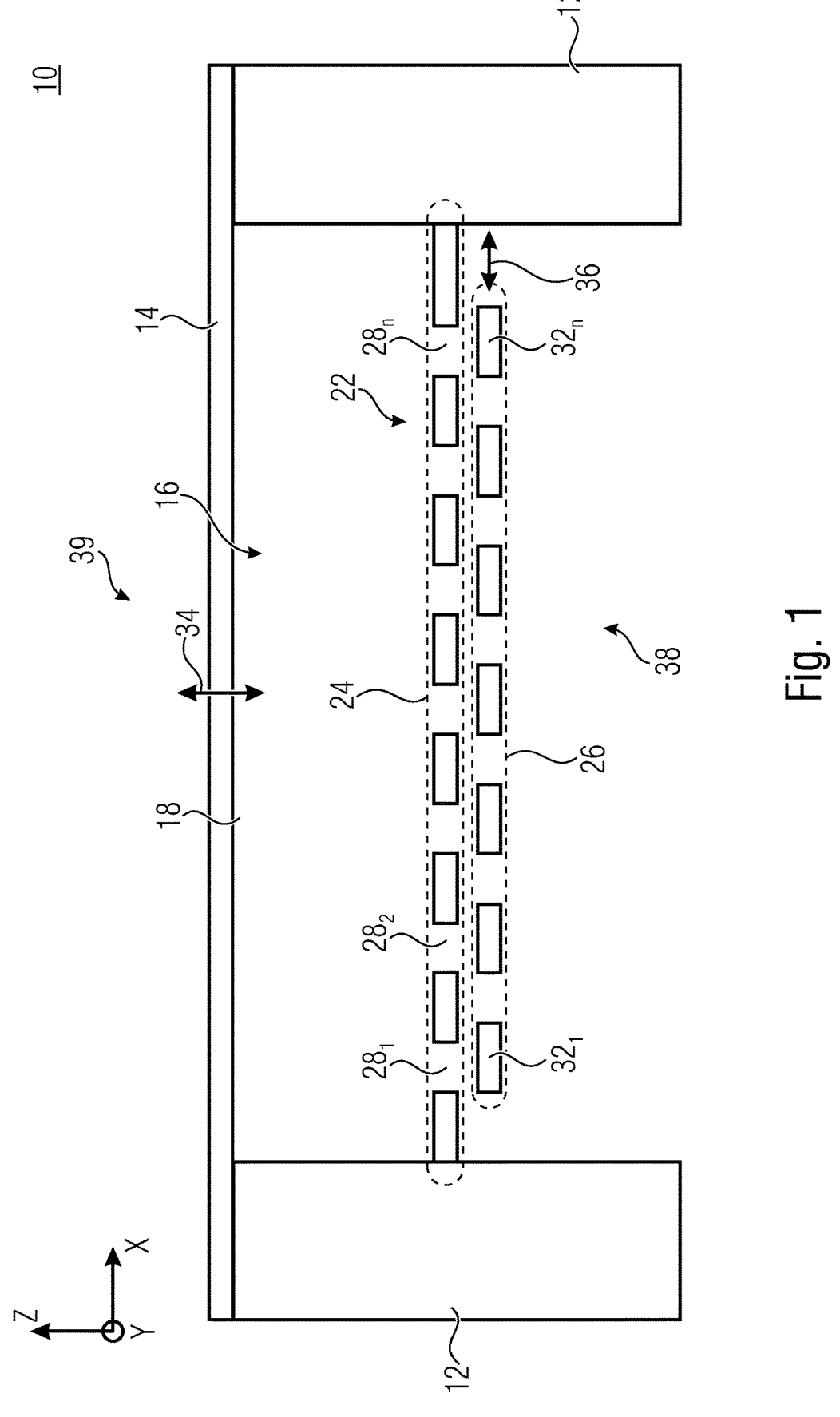
FIG. 1 shows a schematic side view of a MEMS device according to an embodiment.

Equal or equivalent elements or elements with equal or equivalent functionality are denoted in the following description by equal or equivalent reference numerals even if occurring in different figures.

DETAILED DESCRIPTION OF ILLUSTRATIVE EMBODIMENTS

In the following description, a plurality of details is set forth to provide a more thorough explanation of embodiments of the present disclosure. However, it will be apparent to those skilled in the art that embodiments of the present disclosure may be practiced without these specific details. In other instances, well known structures and devices are shown in block diagram form rather than in detail in order to avoid obscuring embodiments of the present disclosure. In addition, features of the different embodiments described hereinafter may be combined with each other, unless specifically noted otherwise.

FIG. 1 shows a schematic side view of a MEMS device 10 according to an embodiment. The MEMS device comprises a substrate 12, e.g., comprising a semiconductor material such as silicon or silicon based materials. Alternatively, or in addition, other types of semiconductor materials may form at least a part of substrate 12, e.g., gallium arsenide or the like.

The MEMS device 10 comprises a membrane structure 14 being mechanically connected to the substrate 12. The membrane structure 14 may be directly or indirectly hinged or connected to the substrate 12. The membrane structure 14 may be provided parallel to a substrate plane, e.g., it may be arranged in an unactuated state essentially parallel to a substrate plane x/y, i.e., in-plane. The membrane structure 14 may be deflectable out-of-plane, e.g., based on an actuation signal and/or based on a pressure of a fluid 16 being present in a cavity 18 of the MEMS device 10, of the substrate 12, respectively. The membrane structure 14 may be implemented as a planar structure having, for example, a rectangular, round or essentially square shape or a structure in between e.g. oval or alveolate. The membrane structure 14, may also be formed as a cantilever beam.

By way of non-limiting example only, a MEMS device may be formed from at least one wafer or other basis structure. Such a wafer may be considered as a plate-like structure that has a comparatively low thickness when compared to longitudinal extensions. Without limiting such considerations to a specific coordinate system or realization of a structure, the longitudinal directions may be considered as defining an in-plane direction of a MEMS device. Such directions are shown in FIG. 1 as x/y-directions. A thickness direction z may be considered as a thickness direction perpendicular to the in-plane directions x/y. The membrane structure 14 may deflect out-of-plane and, thus, along a positive and/or negative z-direction.

The membrane structure 14 is configured for deflecting along the z-direction with a frequency in ultra-sonic frequency range to cause a motion of the fluid 16. The motion may comprise a flow of the fluid 16 through a valve or shutter structure 22 and/or may relate to a pressure or change thereof generated in the cavity 18. For example, the membrane structure 14 may be configured for and controlled to deflect out-of-plane with an ultrasonic frequency. That is, the deflection of the membrane structure 14 may be controlled in a frequency range inaudible for a human. However, by use of a MEMS membrane structure that possibly has a comparatively small size and thus moves a small amount of fluid, a high rate of moving such small amounts may result in considerable fluid set under pressure, e.g., in a front volume. To avoid moving the fluid 16 back and forth with the membrane structure, the controllable valve structure may be used to allow, based on a control signal for the valve structure 22, a fluid pulse or fluid motion away from the membrane structure 14 through the valve structure 22 towards a front volume 38. In addition, the MEMS device 10 may provide for a back volume 39 on a different side of the membrane structure 12. The whole MEMS device 10 may thus offer a front and a back port for fluid and/or sound.

Based on closing the valve structure 22 during a time the membrane structure 14 moves away from the valve structure, e.g., along +z, and again opening the valve structure 22 when the membrane structure 14 moves towards the valve structure 22 again, e.g., along −z, fluid pulses or fluid 16 may be accumulated in the front volume 38.

The membrane structure may move or vibrate with an ultrasonic frequency, e.g. a frequency of at least 20 kHz, at least 30 kHz or even more, i.e., with an ultrasonic frequency range. For example, the membrane may vibrate with a frequency of at least 50 kHz, at least 70 kHz or at least 90 kHz, e.g., approximately or equal to 96 kHz, wherein some structures may also allow for a frequency of at least 200 kHz, 300 kHz or up to 500 kHz or more to cover a range between at least 50 kHz and at most 500 kHz. Such an ultrasonic frequency range may be demodulated to an audible frequency range, i.e., an audio frequency range, e.g., below 20 kHz.

The valve structure 22 and the membrane structure 14 may together sandwich the cavity 18, wherein based on a control of valve structure 22 different fluidic resistances for the fluid may be provided. According to one example, the valve 22 may be switched between an open state in which the valve structure 22 basically provides for a low, negligible or no fluidic resistance and a second state, in which the valve structure 22 may be considered in a closed state in which the valve structure provides for a comparatively higher fluidic resistance for the fluid 16. For example, in the closed state, there may be no or only negligible flow from the fluid 16 through the valve structure 22.

The valve structure 22 may comprise a planar perforated structure 24 and a shutter structure 26 moveable with respect to the perforated structure 24. In one example, the perforated structure 24 may be an immoveable structure, e.g., a statue or the like, for example, immovably connected to the substrate 12. However, according to other examples, both structures, the perforated structure 24 and the shutter structure 26 may be moveably arranged and may move with regard to each other.

The perforated structure 24 may comprise a plurality of openings $28_1$ to $28_n$ that allow the fluid 16 to pass through. According to an embodiment, the shutter structure 26 may comprise structural sections $32_1$ to $32_n$ that are adapted for an opposing position with regard to the openings $28_1$ to $28_n$ in the second position to provide for the second fluidic resistance.

By use of the valve structure 22, the ultrasonic waves in the cavity 18 may be transferred to other frequency ranges, e.g., an audible or audio frequency range.

While using a membrane being deflectable along a direction of movement 34 being possibly parallel to the z-direction, which may allow for a large amount of fluid to be moved, a direction of movement 36 of the valve structure 22, e.g., the shutter structure 26, may allow for a low thickness of the MEMS device 10, may comprise a control unit and/or an interface for a connection with an external control unit. Such a control unit may comprise control circuitry configured for controlling a deflection of the membrane structure 14 to deflect with a first ultrasonic frequency and for controlling the valve structure 22, e.g., an actuator structure connected to the shutter structure 26 to change between the first position and the second position with a same or a different second ultrasonic frequency to generate a sound pressure level in a front volume 38 of the MEMS device 10 in an audio frequency range, the sound pressure level in the audio frequency range being generated from the ultrasonic frequency of the membrane structure 14, i.e., by use of the valve structure 22, the membrane sound may be modulated or demodulated so as to obtain an audio signal. For example, such a demodulation/modulation may comprise an advanced digital sound reconstruction, ADSR, or other ultrasonic demodulation, UD, concepts, e.g., a single-sideband demodulation or dual-sideband demodulation techniques.

Figure 2:
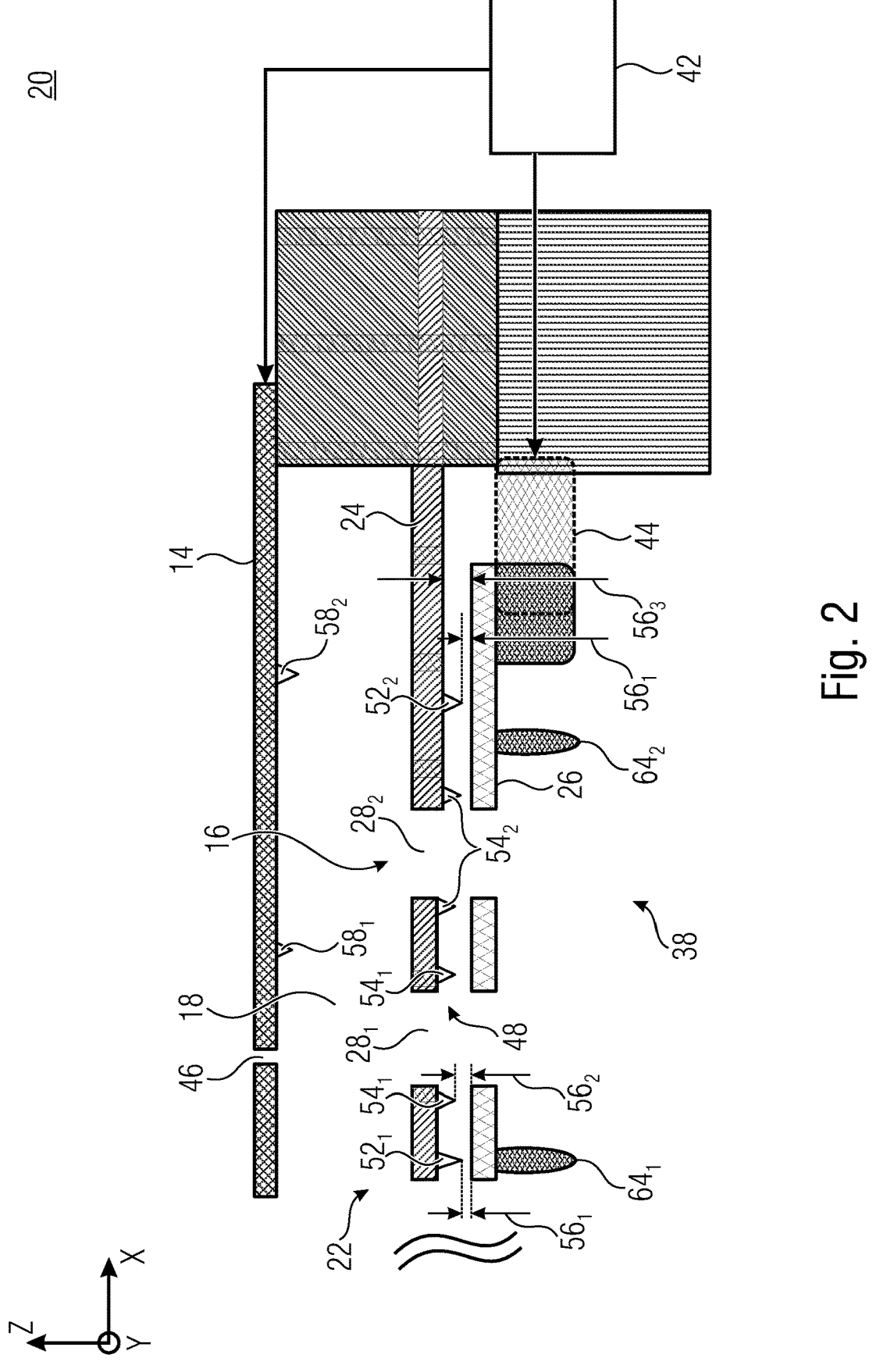
FIG. 2 shows a schematic side view of a part of a MEMS device according to an embodiment having control circuitry.

FIG. 2 shows a schematic side view of a part of a MEMS device 20 according to an embodiment, wherein the details provided may be applied, without limitation, to other MEMS devices described herein.

MEMS device 20 comprises control circuitry 42, e.g., comprising a processing unit, a microcontroller, an application-specific integrated circuit, ASIC, a field programmable gate array, FPGA, or other suitable circuitry, configured for controlling a deflection of the membrane structure 14. The control circuitry 42 is further configured for controlling an actuator structure 44 connected to the shutter structure 26 to change between the first position shown in FIG. 2 and the second position indicated in FIG. 1. The change between the first position and the second position may be obtained with a same or a different ultrasonic frequency and both controls commonly may allow generation of a sound pressure level in the front volume 38, which is in the audio frequency range, i.e., in a frequency range of at least 10 Hz and at most 20 kHz. A MEMS device in accordance with embodiments described herein may have good properties especially in a low frequency audio range, e.g., in a range of at most 1 kHz, at most 800 Hz or at most 500 Hz and even far below. The actuator structure may comprise, for example, a piezoelectric actuator, an electrodynamic actuator or other types of actuating structures. For example, the actuator structure 44 may comprise an electrodynamic comb-structure, a magnetic drive, a piezoelectric drive and/or a thermal drive. The actuator structure 44 may comprise more than a single actuator, e.g., actuator structures 441 and 442 so as to generate active forces along positive and negative directions of movement 36. This may allow for a highly controllable generation of sound when compared to relying on restoring forces of springs only.

By driving the membrane structure 14 and the valve structure 22 with a same or a different ultrasonic frequency, a modulation of the sound generated by the membrane structure 14 may be obtained.

A MEMS device in accordance with an embodiment may comprise a membrane structure 14 that comprises a plurality of ventilation holes 46 configured for a passage of the fluid 16 into the cavity 18 while preventing an acoustic short circuit. The ventilation holes 46 may have a synergetic effect and may, for example, first serve as holes that are used to etch a sacrificial layer to generate at least a part of the cavity 18. The ventilation holes 46 may comprise a comparatively low size along the x- and/or y-direction to prevent for an acoustic short circuit. That is, the ventilation holes 46 may have a high fluidic resistance which increases with $\sim 1/d^4$ wherein d refers to a hole diameter.

That is, the ventilation holes 46 may allow removal the sacrificial layer without generating an acoustic short circuit. Such an acoustic short circuit may be understood as an effect that the membrane structure 14 deflects along a direction, but only provides for insufficient pressure or movement of fluid 16 as the fluidic resistance of the ventilation holes 46 is too low, such that the fluid 16 travels through such holes instead of being moved by the membrane structure. A size of the ventilation holes 46 may be tuned to achieve a fluidic resistance for the fluid 16 that is high enough to allow efficient flow generation through the valve structure 22 and to be low enough to allow for ventilation of the cavity 18 through the membrane structure 14 when the valve structure 22 is in a closed state, i.e., the shutter structure 26 is in the second position. A diameter of such a ventilation hole may be, for example, in a range of at least 0.5 μm and at most 5 μm, at least 0.7 μm and at most 4 μm or of at least 1 μm and at most 3 μm.

Alternatively, or in addition to the ventilation holes 46, the MEMS structure 20 and/or the MEMS structure 10 may comprise a bump structure 48 which may have a set of bumps, a continuous or discontinuous ring-like structure of at least one bump or the like that is arranged between the perforated structure 24 and the shutter structure 26. During manufacturing of the MEMS device 20, the bump structure 48 may, for example, be formed as a part of the perforated structure 24 and/or as a part of the shutter structure 26.

In a closed state of the valve structure 22, the bump structure 48 may prevent a fluid through the valve structure 22 based on a mechanical contact between the perforated structure 24 and the shutter structure 26 via the bump structure 48. That is, although showing a remaining distance between the bump structure 48 and the shutter structure 26, the MEMS device 20 of FIG. 2 may provide for a mechanical contact of the shutter structure 26 with the bump structure 48. The bump structure 48 may synergistically allow for providing a protection against stiction of the shutter structure 26 to the perforated structure 24 and to provide for a sort of a seal, e.g., a ring, around the perforation or opening 28 to pinch-off the flow of fluid 16 in case the shutter structure 26 is in the second position.

According to an embodiment, the bump structure 48 comprises bump elements with different properties and/or for different purposes. For example, the bump elements $52_1$ and $52_2$ may comprise a comparatively long extension along the z-direction, i.e., they may be comparatively long. The bump elements $52_1$ and $52_2$ may be configured for providing a point-like contacting surface with the shutter structure 26 so as to provide for anti-stiction function. By having the bump elements $52_1$, $52_2$ with a point-like surface or at least a small contact area, good anti-stiction properties may be obtained. The bump elements $52_1$ and/or $52_2$ as an alternative or in addition allow having a low amount of disturbing noise in the demodulated audio signal as a surface area that generates friction and thereby possibly noise when changing the position of the shutter structure 26 is small.

According to an embodiment, a MEMS device according to the present disclosure may provide for anti-stiction bumps $52_1/52_2$ between the perforated structure 24 and the shutter structure 26 and may comprise a sealing structure $54_1/54_2$ between the perforated structure 24 and the shutter structure 26. A remaining gap $56_2$ in an area of the sealing structure $54_1/54_2$ may be larger when compared to a gap $56_1$ in an area of the anti-stiction bumps $52_1/52_2$.

The bump structure 48 may alternatively or in addition comprise a continuous or segmented bump element $54_1/54_2$ that may form at least a part of a ring through a respective opening $28_1$, $28_2$ respectively. When compared to the bump elements $52_1$, $52_2$, a length along the z-direction of bump elements $54_1$, $54_2$ may be smaller. A reduced length or height of bumps $54_1$, $54_2$ when compared to bump elements may result, at least during regular operation, in that the bump elements $54_1$, $54_2$ do not provide for a mechanical contact but reduce or at least partly obstruct a slit along the z-direction, the slit being between the perforated structure 24 and the shutter structure 26. That is, elements $54_1$ and $54_2$ are not necessarily bumps but can also for a different type of protrusion or elevation.

To have different heights of bump elements used for different purposes may allow to maintain good anti-stiction properties by use of bump elements $52_1$, $52_2$ even in case of having a comparatively large surface provided by sealing bumps or sealing elevations 54 as they do not necessarily contribute to the anti-stiction functionality. A gap $56_1$ remaining between bump elements $52_1$ and shutter structure 26 may be comparatively low, down to zero in a case where the bumps contact or abut the opposing structure. A gap $56_2$ between the bump element $54_1$ or $54_2$ on the one hand and shutter structure 26 on the other hand may, at a same time, be non-zero which may be interpreted as a remaining pinching slit even if the valve structure 22 is in a closed position. Such a gap may have a size, for example, of at least 100 nm and at most 1000 nm, of at least 200 nm and at most 700 nm or of at least 300 nm and at most 500 nm. A gap $56_3$ between the shutter structure 26 and the perforated structure 24 may, at a same time, be in a range of at least 600 nm and at most 1500 nm. That is, bump elements $54_1$ and $54_2$ may provide to tighten or seal the cavity 18 even if a small gap $56_2$ remains.

Bump structure 48 does not prevent bump elements $58_1$ and/or $58_2$ to be arranged between the membrane structure 14 and the valve structure 22. It has to be noted that the perforated structure 24 or the shutter structure 26 may be arranged closer to the membrane structure 14 when compared to the other structure.

Alternatively, or in addition to the bump structure 48 and/or the ventilation holes 46, the shutter structure 26 may comprise a mechanical stiffening $64_1$, $64_2$ configured for suppressing an out-of-plane deflection of the shutter structure 26. For example, the mechanical stiffening $64_1$, $64_2$ may comprise a locally increased thickness of the shutter structure 26, e.g., a beam-like structure or a bar-like structure. Alternatively, or in addition, an additional layer or structure may be arranged to locally stiffen the shutter structure to increase weight of the moved structure only as much as desired. Alternatively, or in addition to the stiffening of the perforated structure, wherein the shutter structure may comprise a mechanical stiffening, the mechanical stiffening configured for suppressing an out-of-plane deflection of the shutter structure.

Figure 3A:
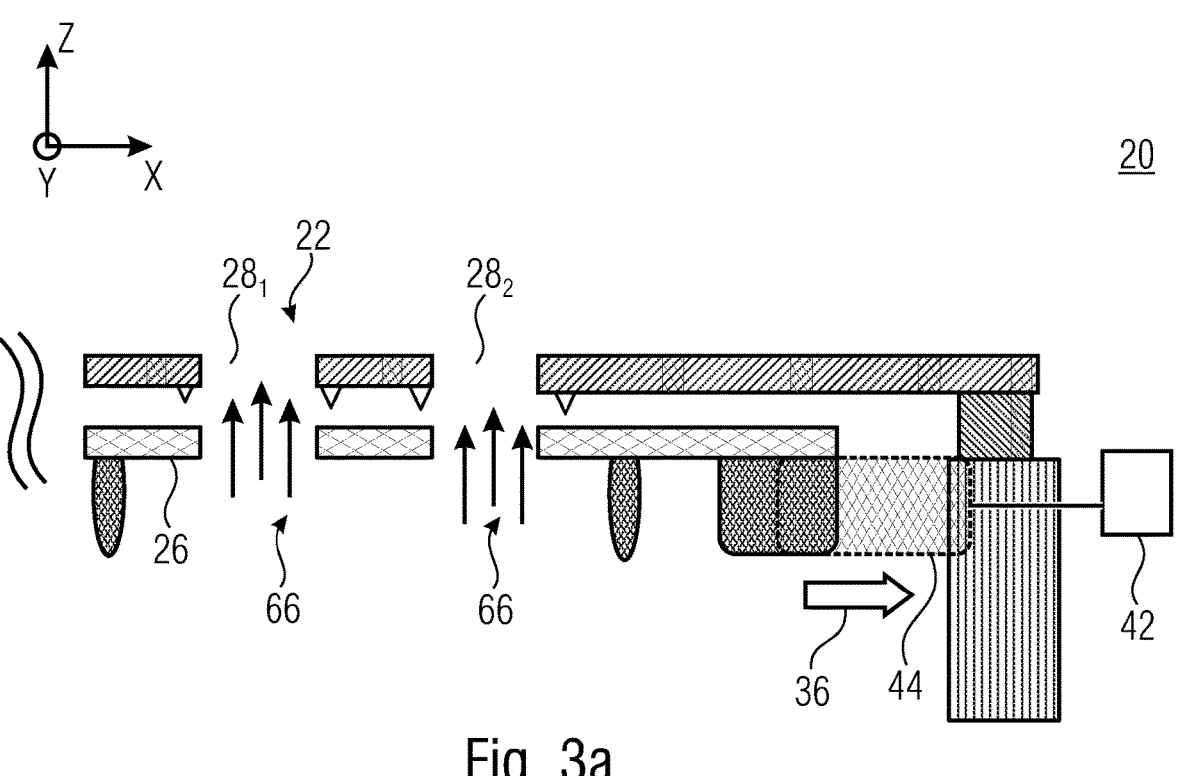
FIG. 3a shows a schematic side view of a part of the MEMS device of FIG. 2 in a first position of a shutter structure.
Figure 3B:
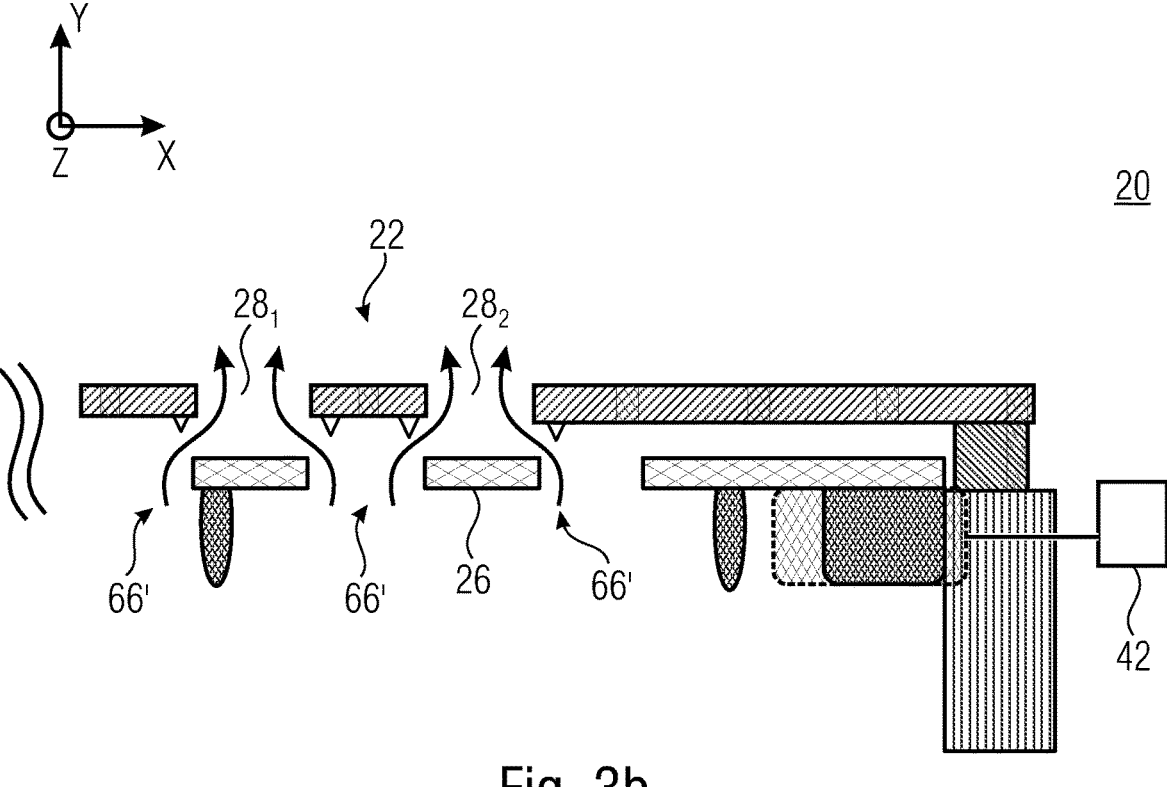
FIG. 3b shows a schematic side view of a part of the MEMS device of FIG. 3a in a second position of the shutter structure.

FIG. 3a shows a schematic side view of a part of the MEMS device 20 in which the valve structure 22, the shutter structure 26 respectively is in the first position. In the first position, a low resistance for a fluid or a flow thereof is provided by valve structure 22 as indicated by arrows 66. The control circuitry 42 may control the actuator structure 44 to move the shutter structure 26 along the direction of movement 36 to arrive at the second position indicated which is shown in the schematic side view of the part of the MEMS device 20 in FIG. 3b.

Alternatively, or in addition, the control circuitry 42 may control the actuator structure 44 to actively move the shutter structure from the second position into the first position. A rest position of the shutter structure 26 may at least partially be based on hinges or spring structures and the actuator structure 44 may be controlled to move the shutter structure away from such a rest position. Arrows 66' in FIG. 3b indicate a high resistance provided by valve structure 22 arriving at a low amount of fluid travelling through openings $28_1$ and $28_2$.

According to an embodiment, the shutter structure 26 may comprise a lattice structure comprising at least one bar that, when being projected into a common plane parallel to the substrate plane x/y, overlaps with an opening 28 of a perforation of the perforated structure 26 in the second position and reveals at least a part of the opening in the first position when being projected into the common plane as shown, for example, in FIG. 3a.

Figure 4A:
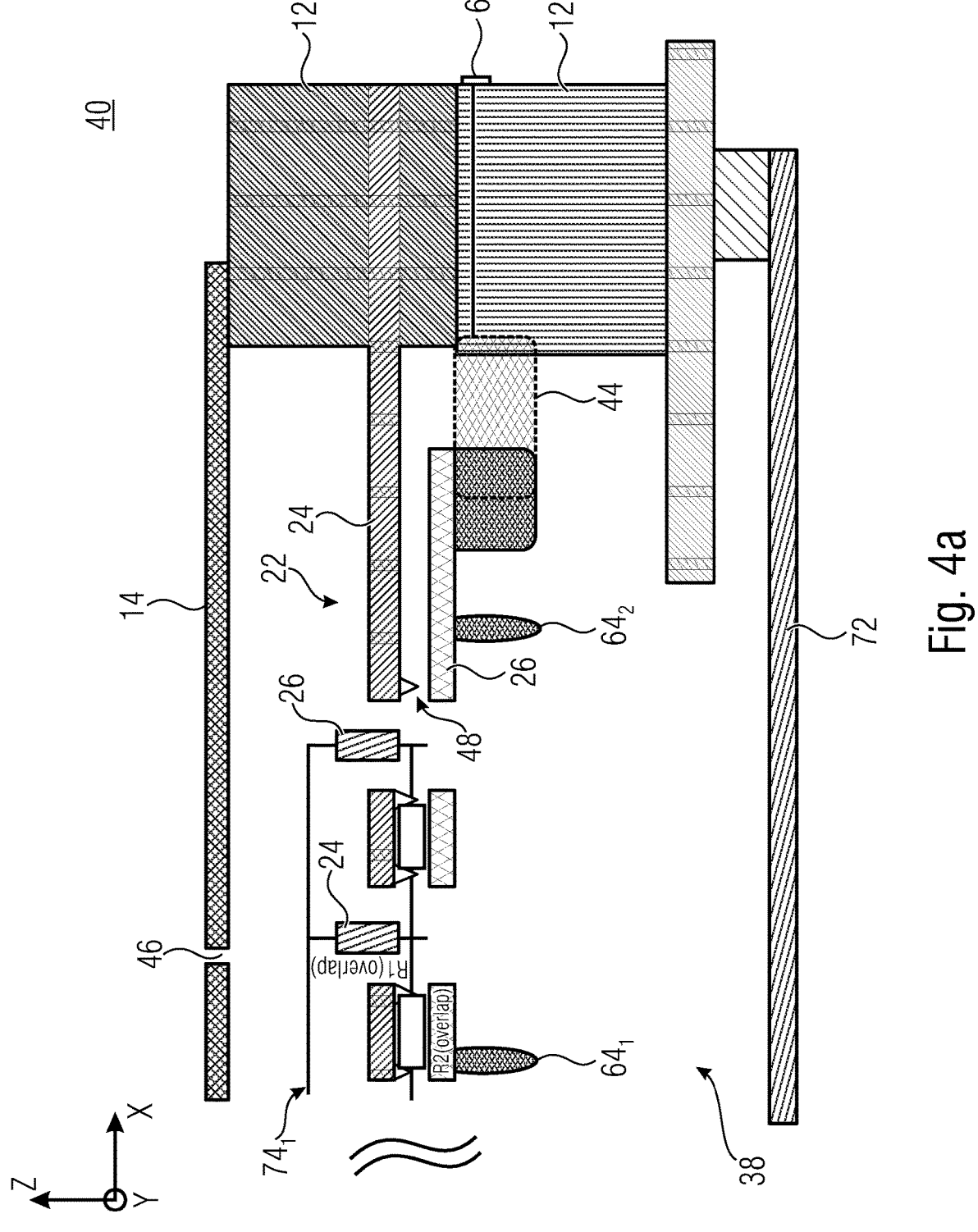
FIG. 4a shows a schematic side view of a MEMS device according to an embodiment having an interface for a connection to exchange a signal with an external control circuitry and in the first position of the shutter structure.

FIG. 4a shows a schematic side view of a MEMS device 40 according to an embodiment. The MEMS device 40 comprises, for example, an interface 68 to allow a connection to exchange a signal with an external control circuitry, while the control circuitry 42 of a MEMS device 20 may be an internal circuitry of the MEMs device.

Alternatively, or in addition, the MEMS device 40 may comprise a protective structure 72 which may also be arranged at MEMS device 10 and/or 20. The protective structure 72 may be transparent for a sound pressure level, e.g., in the audio range, of the fluid while being configured for mechanically protecting the valve structure 22. The protective structure 72 may sandwich the valve structure 22 together with the membrane structure, i.e., the valve structure 22 may be arranged between the membrane structure 14 and the protective structure 72. The protective structure 72 may comprise, for example, a plastic material, a semiconductor material and/or a glass material. For example, a plastic material, i.e., a membrane comprising the plastic material, may be well-suited to block ultrasonic sound while being transparent for audible frequencies. A glass structure forming at least a part of the protective structure 72 may comprise a mesh-like structure, may provide for a high mechanical robustness, and may comprise small openings that may act as ventilation holes. Alternatively, or in addition, a structured glass may be provided, e.g., as a part of a glass package, may be provided with a kind of perforation to block particles on the one hand side but also to attenuate the ultrasound signal(s) on the other side.

Figure 4B:
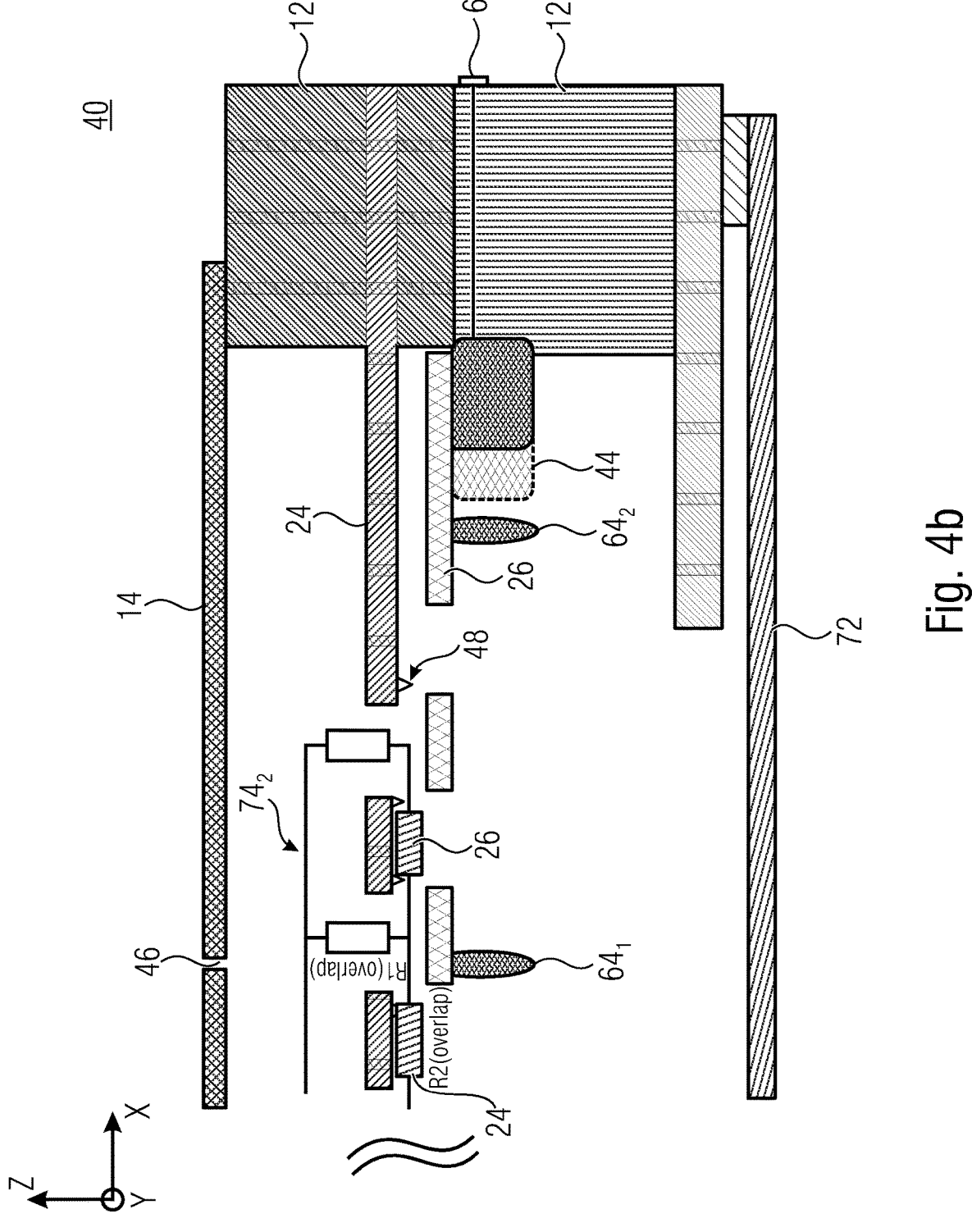
FIG. 4b shows the MEMS device of FIG. 4a in the second position of the shutter structure.

FIG. 4b shows a schematic side view of the MEMS device 40 of FIG. 4a where the shutter structure 26 is in the second position. As shown in a schematic equivalent circuit diagram 74 in FIGS. 4a and 4b, the fluidic resistance of FIG. 4a represented therein may be understood as parallel connection of resistors while the second position shown in FIG. 4b may result in a serial-connection. In an electronic analogy, the parallel connection may result in a lower effective resistance when compared to the serial-connection.

The external or internal control circuitry may be configured for controlling the actuator structure 44 to move the shutter structure 26 into the first position or into the second position at an instance of time based on a deflection state of the membrane structure 14 at that instance of time. That is, the control circuitry may temporally align a control of the membrane structure 14 and of the shutter structure 26. For example, the control circuitry may control the actuator structure 44 so as to provide for the first position of the valve structure at a time when the membrane provides for pressure in the cavity or may provide for a closed state of the valve structure 22 at this time. For example, the control circuitry 42 may be configured for controlling the actuator structure 44 and the membrane structure 14 for aggregating a fluidic pressure of the fluid motion generated by the membrane structure 14 to have an aggregated pressure in the front volume by use of the valve structure. In other words, the membrane structure 14 may aggregate pressure, e.g., by pumping a contribution in the front volume while having the valve structure 22 in an open state and the valve structure 22 may be controlled into a closed state when the membrane 14 moves back again. According to other types of ultrasonic demodulation, e.g., ADSR, the membrane structure on the one hand and the shutter position on the other hand may also be unsynchronized.

Figure 5A:
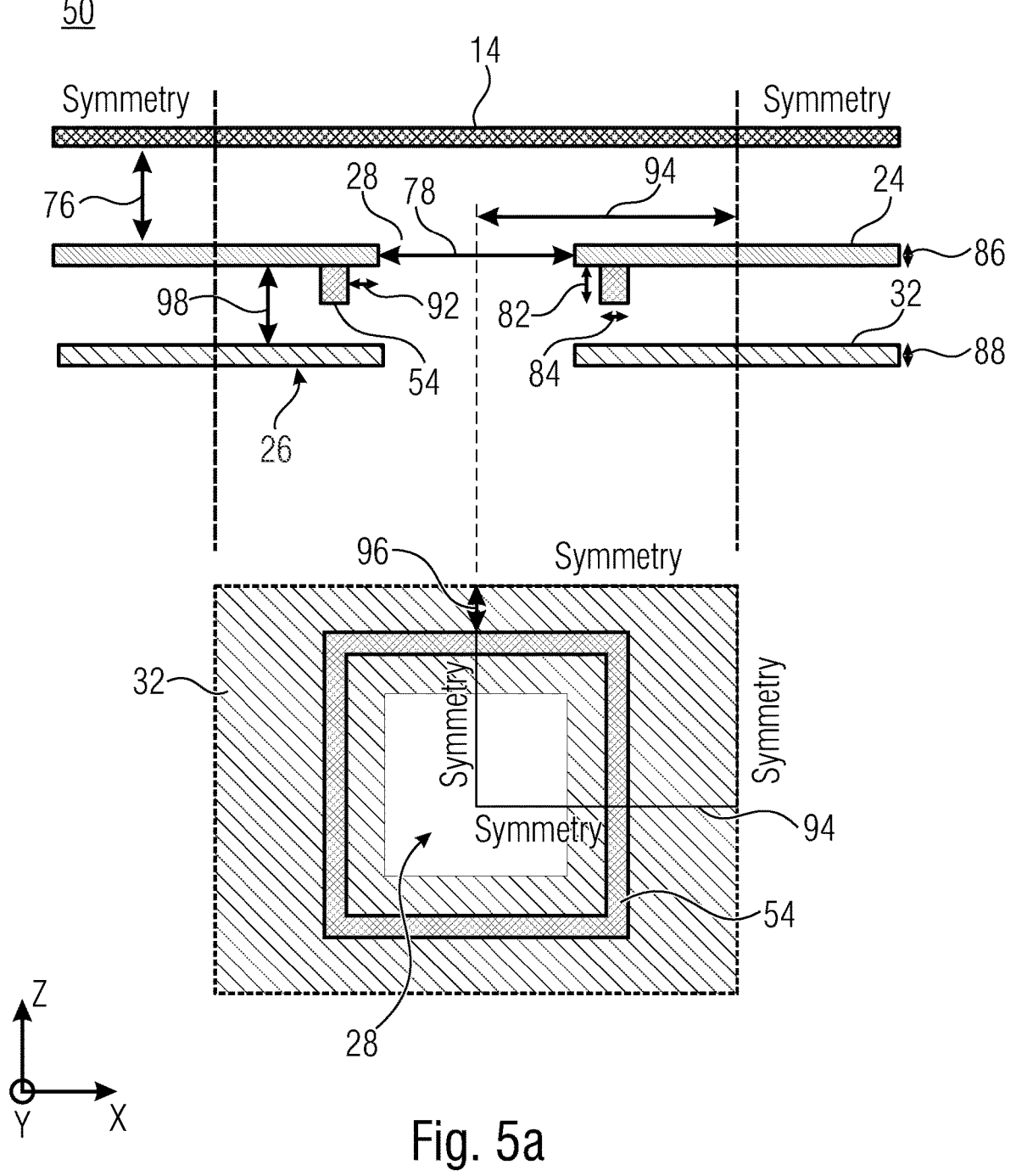
FIG. 5a shows schematic views of a MEMS device according to an embodiment, and in the first position of the shutter structure for illustrating possible dimensions of the MEMS device.

FIG. 5a shows schematic views of a MEMS device 50 according to an embodiment, wherein the details provided may be applied, without limitation, to other MEMS devices described herein.

A gap 76 between the membrane structure 14 and the valve structure 22, e.g., the perforated structure 24 may have any suitable value which may be designed in accordance with a maximum deflection of the membrane structure 14 which may depend, for example, on the driving voltage and/or a diameter of the membrane structure 14. A size 78, e.g., a diameter, of a hole 28 of the perforated structure 28 may be, for example, in a range of at least 3 μm and at most 5 μm.

An extension 82 of bump elements 54 along the z-direction may be, for example, in a range of at least 100 nm and at most 500 nm, of at least 150 nm and at most 400 nm or at least 200 nm and at most 300 nm or other suitable values to arrive at the gaps described in connection with FIG. 2.

An extension 84 perpendicular to extension 82 may be, for example, in a range of at least 100 nm and at most 700 nm, of at least 150 nm and at most 600 nm or of at least 300 nm and at most 500 nm.

A thickness 96 of, e.g., the perforated structure 24 may comprise, for example, at least 100 nm and at most 2 μm, at least 200 nm and at most 1 μm or at 300 nm and at most 600 nm.

A thickness 88 of the shutter structure 26 may be in a same range and may have a same or a different value.

An overlap 92 starting from the bump element 54 towards the opening 28 of the perforated structure 24 may have a size of, for example, at least 100 nm and at most 800 nm, at least 150 nm and at most 700 nm or of at least 200 nm and at most 500 nm. An extension 94 may comprise half of extension 78, the overlap extension 92 and a width 84 and may form a basis for a symmetry used for generating the perforated structure 24 and/or the shutter structure 26.

Figure 5B:
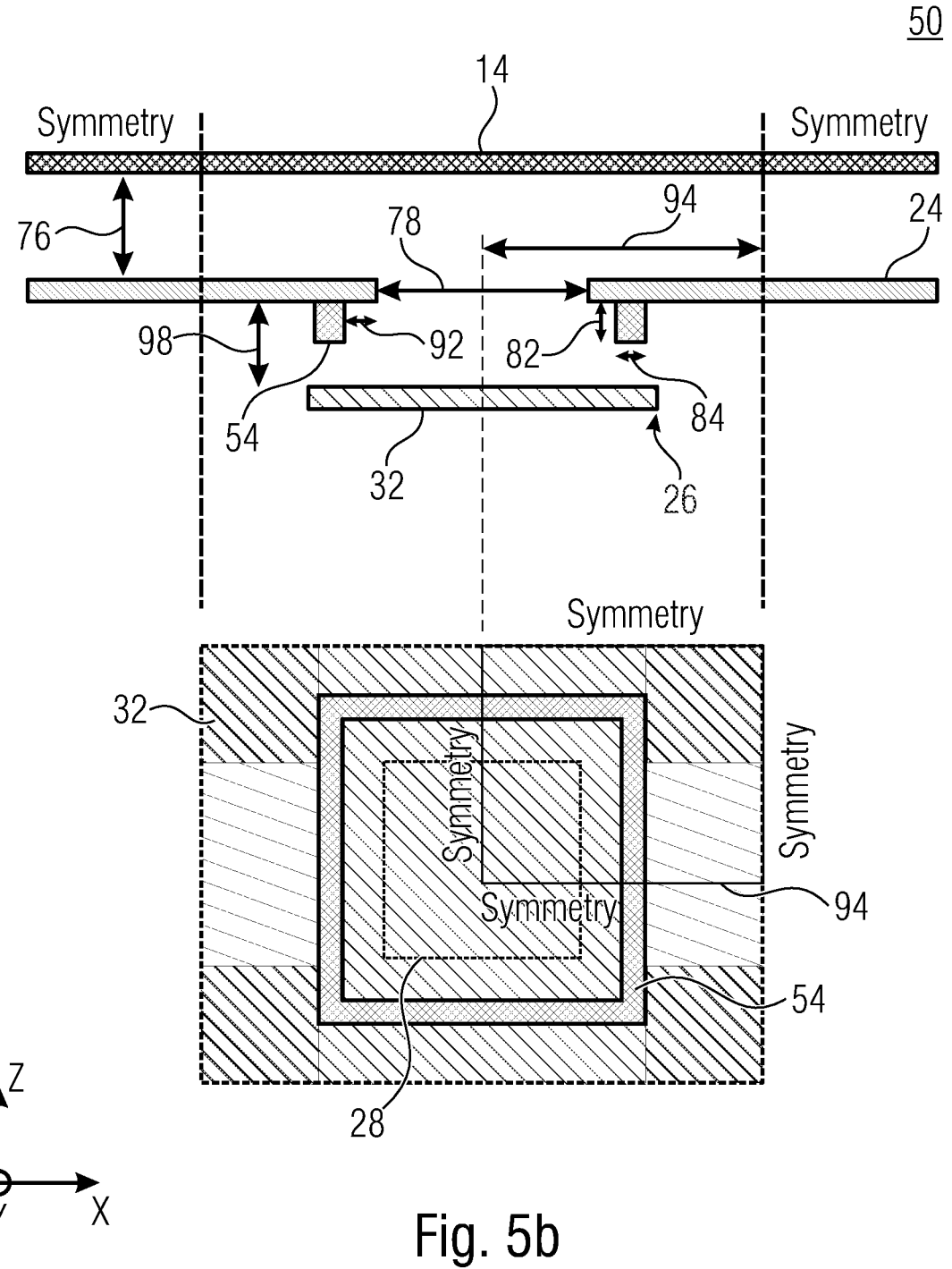
FIG. 5b shows schematic views of the MEMS device of FIG. 5a in the second position of the shutter structure for illustrating possible dimensions of the MEMS device.

An additional extension is shown in the top view of FIGS. 5a and 5b may be in a range of, for example, at least 1 μm and at most 10 μm, at least 2 μm and at most 7 μm, or of at least 3 μm and at most 5 μm.

A gap 98 between the perforated structure 24 and the shutter structure 26 may be in a range, for example, of at least 100 nm and at most 800 nm, of at least 150 nm and at most 600 nm or of at least 300 nm and at most 500 nm.

In the schematic illustration of FIG. 5b, the structural section 32 of shutter structure 26 is moved so as to overlap the opening 28 and optionally the bump elements 54 so as to provide for the closed state of valve structure 22.

Figure 6A:
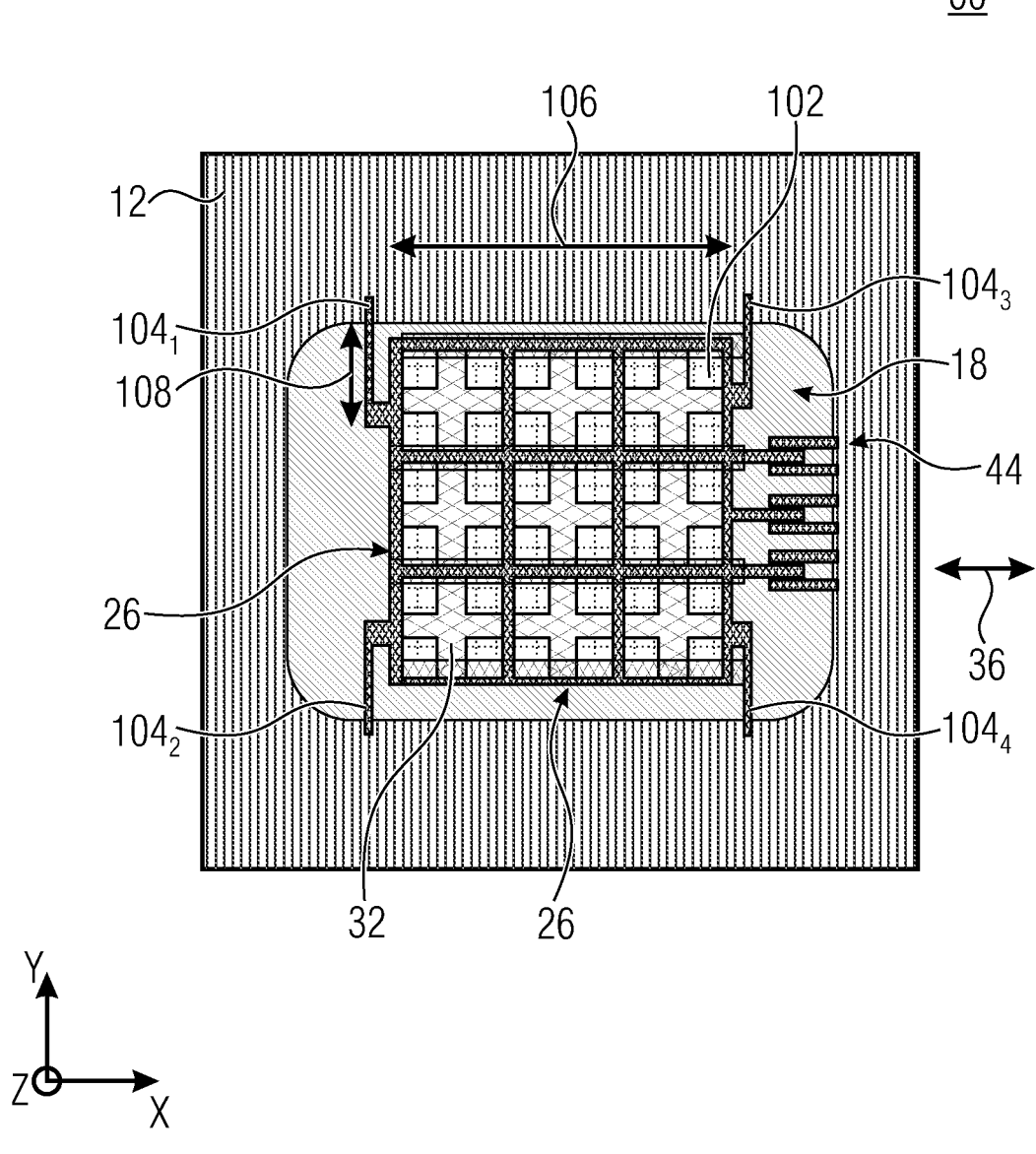
FIG. 6a shows a schematic top view of a part of a MEMS device according to an embodiment to illustrate details of a shutter structure.

FIG. 6a shows a schematic top view of a part of a MEMS device 60 according to an embodiment, wherein the details provided may be applied, without limitation, to other MEMS devices described herein. In particular, a layer of the shutter structure 26 is shown. A two-dimensional layout of the structural section 32 of the shutter structure 26 is shown, leading also to a two-dimensional arrangement of openings 102 that may overlap openings 28 of a perforated structure in the first state. One or more spring structures $104_1$ to $104_4$ in FIG. 6a may form a part of the MEMS device 60. The at least one spring structure $104_1$ to $104_4$ may be formed, for example, as a ridge or other type of spring that may allow to move the shutter structure 26 along the x- and/or y-direction while preventing such a movement, for example, along a z-direction. A geometry of spring structures $104_1$ to $104_4$ may also restrict a movement of the shutter structure 26 along one of the directions x and y while facilitating the movement along the other direction, e.g., the direction x along which the actuator structure 44 may generate a force so as to deflect the shutter structure 26. That is, the spring structure may, at least in the combination of spring elements, comprise an out-of-plane mechanical stiffness along the z direction being larger when compared to an in-plane mechanical stiffness along the direction of movement 36.

The spring structures $104_1$ to $104_4$ may elastically hinge the shutter structure 26, e.g., at the substrate 12 and/or at the stator or perforated structure 24 in a rest position, the actuator structure 44 configured for deflecting the shutter structure 26 in-plane along a direction of movement, e.g., x, and out of the rest position.

An extension 106 of the shutter structure 26 along x and/or y may be, for example, in a range of at least 500 μm and some millimeter, e.g., around 1 mm. A length 108 of the spring structures $104_1$ to $104_4$ may be in a range of at least 50 μm and at most 300 μm, at least 70 μm and at most 200 μm or at least 90 μm and at most 150 μm, e.g., 100 μm. Those dimensions are example values only as well as the number of spring structures 104. For example, one, two, three or more than four spring structures 104 may be arranged, e.g., six, eight, nine or more. Alternatively, or in addition, the structural extensions may comprise any other value.

Figure 6B:
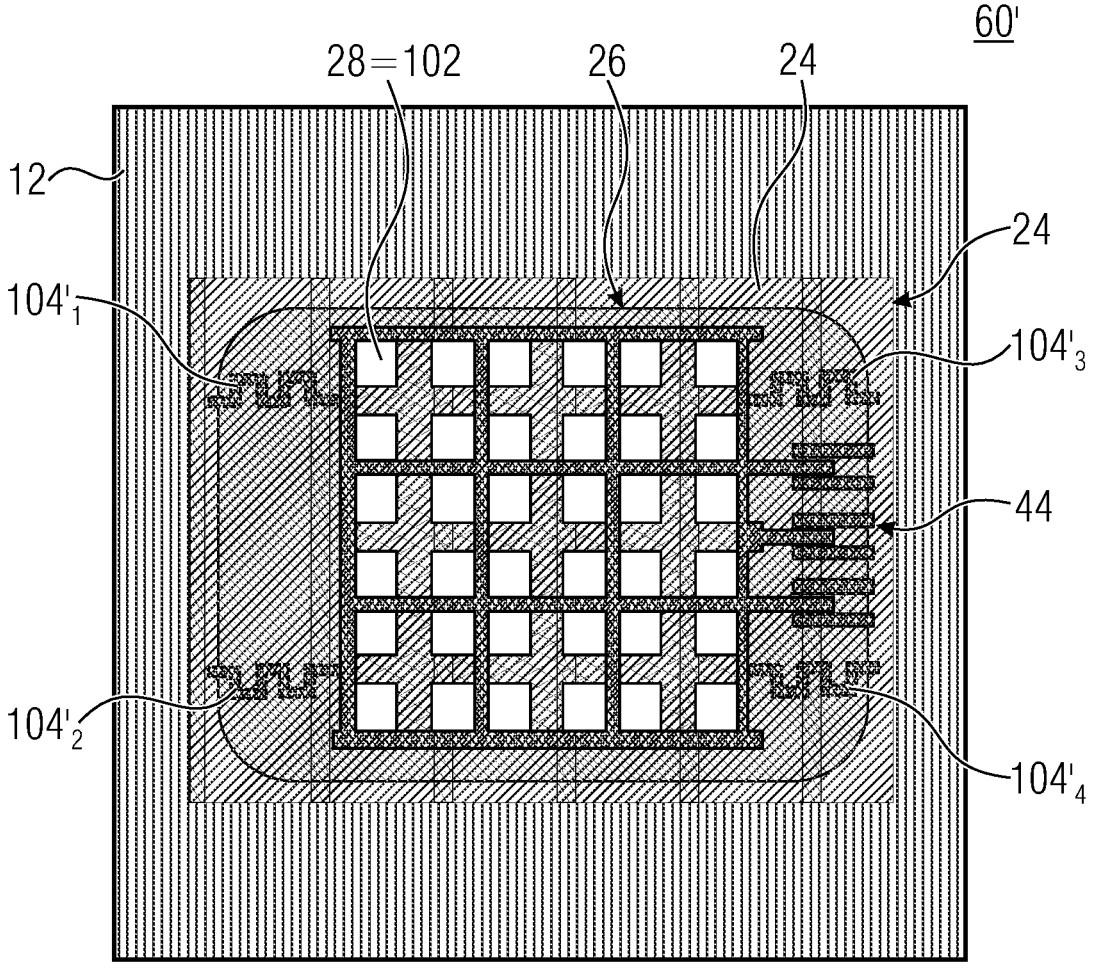
FIG. 6b shows as schematic top view of a layer of a perforated structure according to an embodiment.

FIG. 6b shows as schematic top view of a layer of the perforated structure 24 according to an embodiment. When compared to the MEMS structure 60, spring elements $104'_1$ to $104'_4$ may be configured for compression and elongation while spring structures $104_1$ to $104_4$ may be configured for bending.

As may be seen from FIG. 6b, openings 28 and 102 may overlap in the illustrated first position of the shutter structure 26.

Based on spring structures 104, 104' and/or a combination thereof which forms also an embodiment, the shutter structure 26 and the at least one spring structure may form at least a part of a resonator having a resonance frequency, said resonance frequency being in the ultrasonic frequency range of, for example, at least 20 kHz, at least 30 kHz, at least 40 kHz or more.

Figure 7:
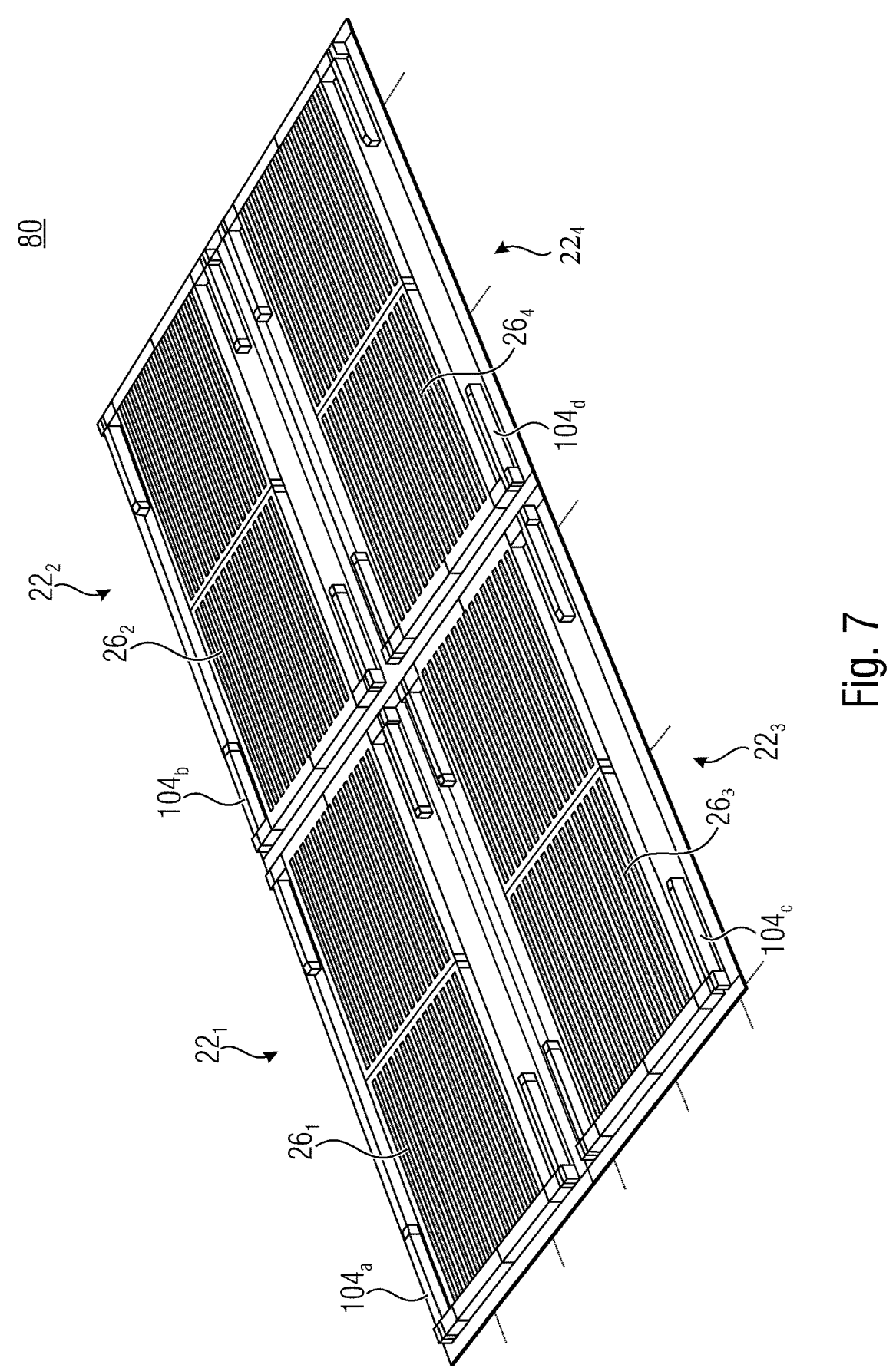
FIG. 7 shows a schematic perspective view of a shutter element part of a MEMS device according to an embodiment having a plurality of valve structures.

FIG. 7 shows a schematic perspective view of a part of a MEMS device 80 according to an embodiment, wherein the details provided may be applied, without limitation, to other MEMS devices described herein. Therein, for example, more than one, e.g., four valve structures $22_1$ to $22_4$ may be arranged in a one-dimensional or two-dimensional array. FIG. 7 shows the shutter structures $26_1$ to $26_4$ of the respective valve structures $22_1$ to $22_4$. As an example, each shutter structure $26_1$ to $26_4$ may comprise a dimension of approximately 100 μm×200 m in the x/y-plane, wherein other dimensions are possible and/or shutter structures $26_1$ to $26_4$ may be formed of different sizes.

FIG. 7 illustrates an embodiment where a plurality of valve structures $22_1$ to $22_4$ sandwich the cavity together with a common membrane structure, wherein control circuitry being part of or connected to the MEMS structure 80 may be configured for controlling the membrane structure 14 and for individually controlling a position of the plurality of valve structures $22_1$ to $22_4$ for providing different spectra of the fluidic motion from the cavity with the plurality of valve structures. An individual control may comprise an individual control signal provided by the control circuitry and/or may comprise different resonance frequencies of a respective resonator structure which may comprise different stiffnesses of spring structures $104a$ to $104d$ that may hinge the respective shutter structure $26_1$ to $26_4$ and/or different masses contributing to the resonator structure.

This may result in different frequencies of movement for the resonator structures $26_1$ to $26_4$ to a respective control signal having the intended frequency or being of a broadband characteristic so as to excite resonant movement of one, more or all of the resonator structures.

This may allow generation of more than a single tone or frequency component with the MEMS structure at a time.

Figure 8:
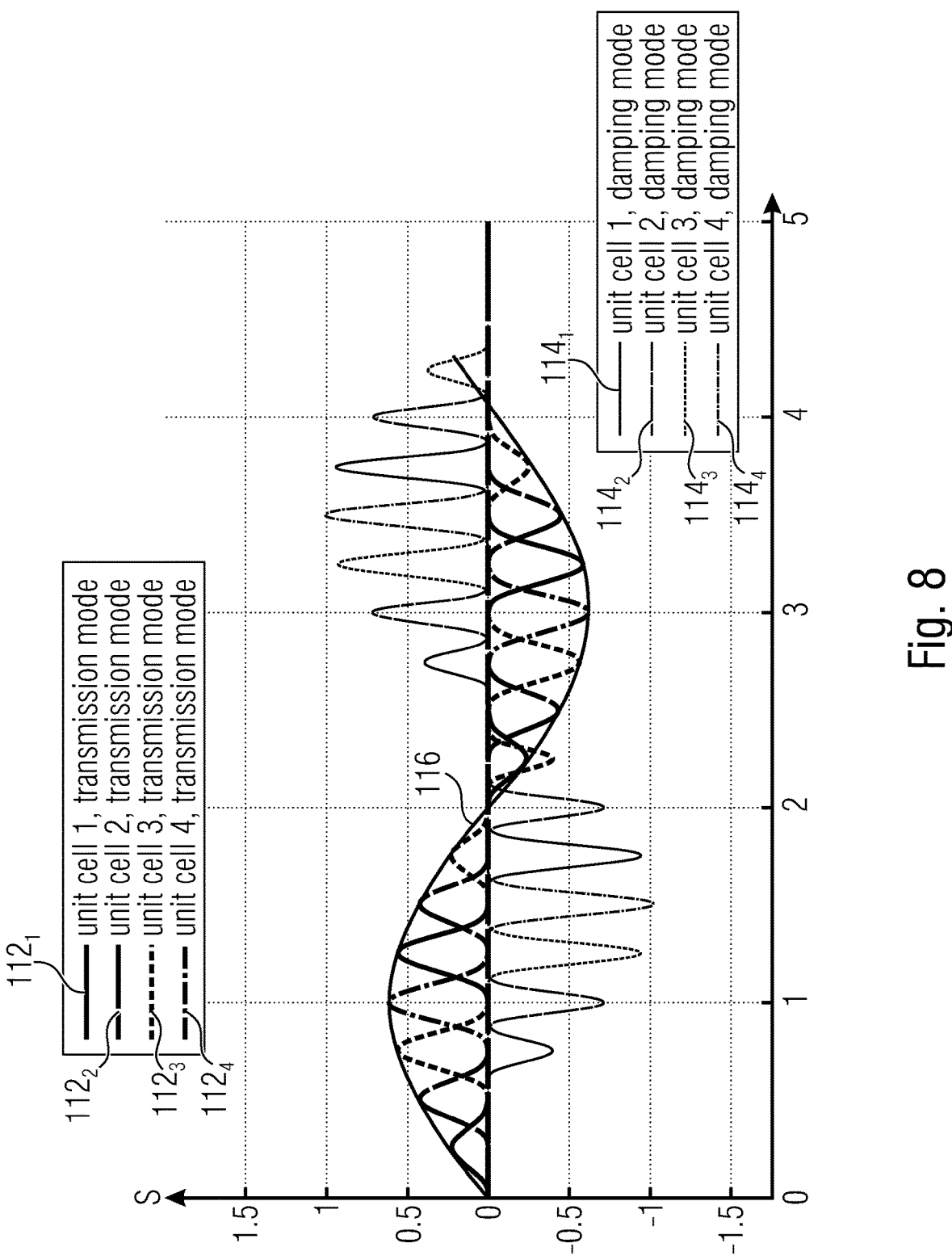
FIG. 8 shows a schematic diagram for illustrating the superposition of single sound pulses generated to reconstruct the analog audio signal after the ultrasonic demodulation according to an embodiment.

FIG. 8 shows a schematic diagram for illustrating such a concept. There is plotted a time axis at the abscissa and an example normalized sound pressure level S at the ordinate. Plots $112_1$ to $112_4$ schematically show pressure levels generated with a respective unit cell, e.g., by use of one of shutter structures $26_1$ to $26_4$ of MEMS device 8o. Based on different pressure pulses, an overall sound 116 may be formed based on a superposition of partial sound pressure contributions $112_1$ to $112_4$. Plots $114_1$ to $114_4$ show, for a respective same cell the contribution in a damping mode, i.e., during a time where the membrane moves backward but where the valve structure is closed, wherein, as described above, a synchronization is not required. In other words, the vibration of the membrane structure on the one hand and the vibration related to the operation of the valve structures on the other hand may remain unsynchronized. According to an embodiment, the valve columns itself may have a constant phase shift of, e.g., 90°, to each other.

Figure 9:
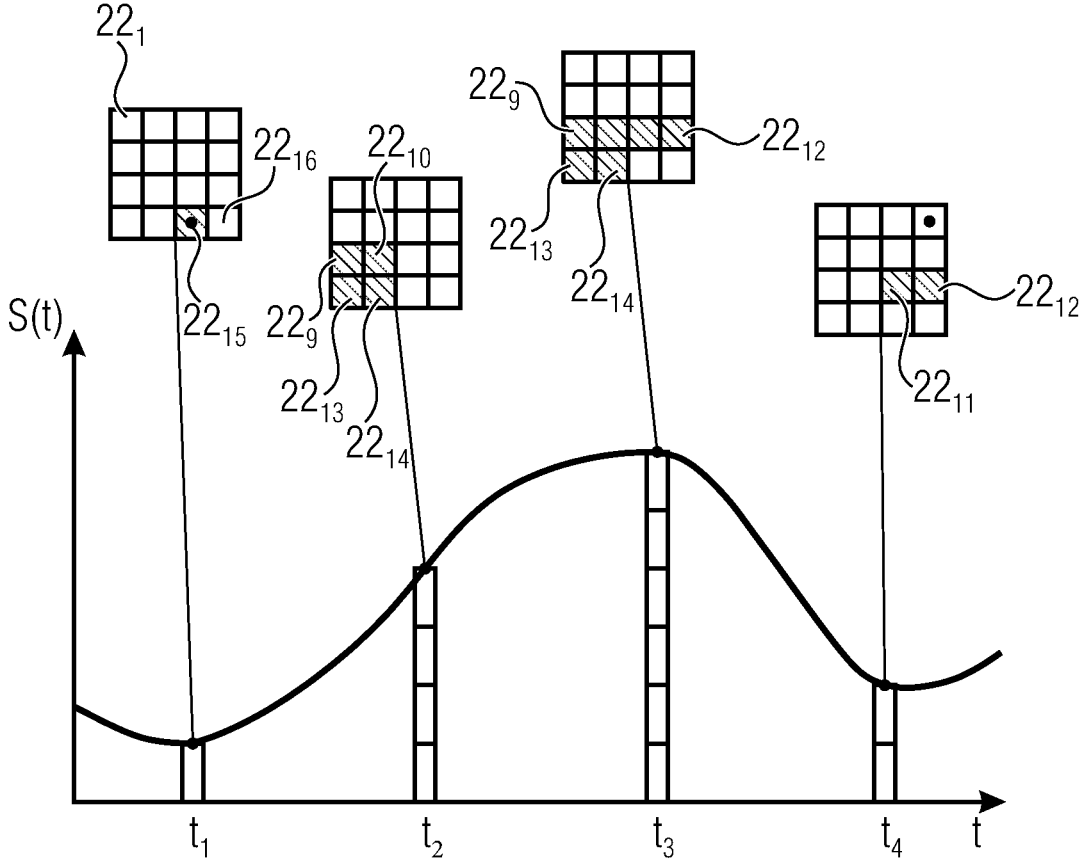
FIG. 9 shows a schematic plot illustrating a possible sound pressure characteristic over time generated with different shutter configurations according to an embodiment.

FIG. 9 shows a schematic plot illustrating a possible sound pressure S over time t for a MEMS device that comprises, for example, 16 valve structures $22_1$ to $22_{16}$ arranged in an example quadratic two-dimensional array, wherein any other number of valve structures and/or any other layout is possible. FIG. 9 shows that during different times, e.g., time instances $t_1$, $t_2$, $t_3$ and/or $t_4$ a different number of valve structures $22_1$ to $22_{16}$ may participate in sound generation and/or that different valve structures, for example, to arrive at different spectra, volume components or contributions to an overall sound, may be used to generate sound. During time instance $t_1$, a single valve structure $22_{15}$ is active in the described example. During time instance $t_2$, a number of four valve structures $22_9$, $22_{10}$, $22_{13}$ and $22_{14}$ may be active, e.g., providing for an aggregated sound pressure of a superposition of the same or different spectra associated with the respective valve structure.

During time instance $t_3$, valve structures $22_9$ to $22_{15}$ provide for a superposition of, in total, six contributions, while during time instance $t_4$, valve structures $22_{11}$ and $22_{12}$ may be active. According to an embodiment, a MEMS structure may comprise a two-dimensional array in which, for example, one of a line or column provides for valve structures of different spectra and the respective other dimension provides for valve structures of a same spectrum to allow an increase of sound pressure to be generated. This may allow to control the spectra (volume) components and/or the amplitude of audible sound to be obtained with the MEMS device.

Figure 10:
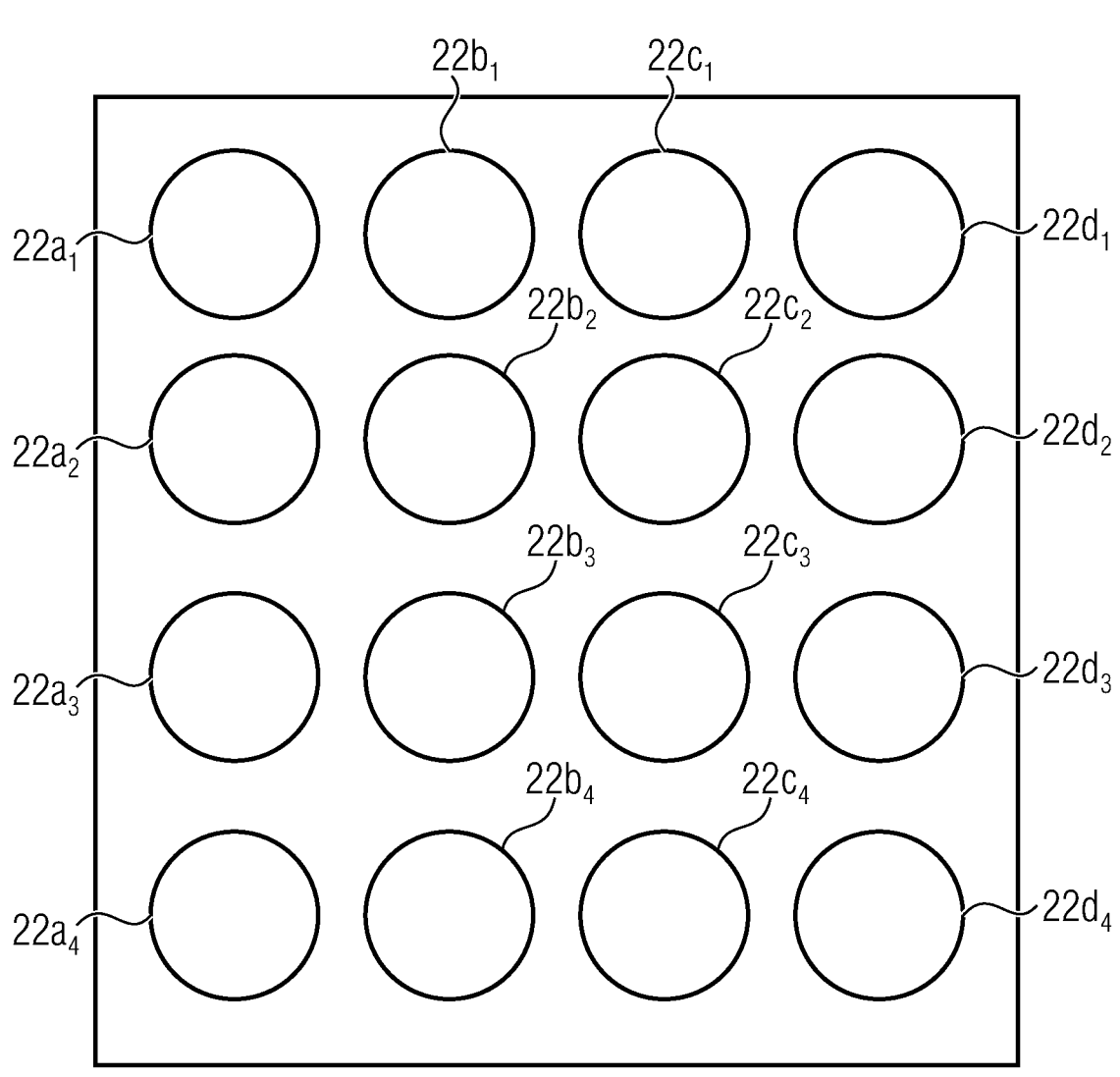
FIG. 10 shows a schematic top view of a part of a MEMS device according to an embodiment having a plurality of valve structures.

FIG. 10 shows a schematic top view of a part of a MEMS device 110 according to an embodiment, wherein the details provided may be applied, without limitation, to other MEMS devices described herein. In acoustic communication with a single membrane structure 14, an arrangement of valve structures $22a_1$ to $22d_4$ may be arranged in four lines and four columns. This does not exclude having a second, further membrane structure in acoustic communication with additional valve structures and/or having a different number of valve structures, a different number of lines and/or a different number of columns of valve structures in communication with the membrane structure 14. For example, valve structures $22a_1$ to $22a_4$ may be formed so as to comprise a same resonance frequency, e.g., based on spring structures. Valve elements $22b_1$ to $22b_4$ may comprise a different second resonance frequency while valve structures $22c_1$ to $22c_4$ and $22d_1$ to $22d_4$ may comprise a third and fourth resonance frequency. Based on a suitable control signal, this may allow to contribute with different spectra to the audible signal, e.g., for the ultrasonic demodulation or suppression being implemented in the MEMS device. A use of one, two, three or four of the respective valve structure 22a, 22b, 22c or 22d may allow to increase or reduce a sound pressure contribution of said frequency, while a deactivation of all of the respective valve structures having a resonance frequency may lead to an absence of said spectrum. As described, such a MEMS device may be configured for a use with an ultrasonic demodulation concept, e.g., to individually operate different valve structures in communication with a same membrane with different operation frequencies.

Such a structure may allow for a detailed controlled of the generated output. For example, the membrane may be operated at a resonance frequency thereof and valve structures may be operated at a resonance frequency thereof. A vibration or movement of the shutter structure of different rows may be operated in resonance each and with a phase shift of 90° with regard to one another to emulate the analogue sound. An amplitude of the sound may be adapted via a parallel path having a further shutter structure.

A use of an individual mechanical resonance may be a part of one solution of generating a movement of the shutter structures of the corresponding valve structures 22a-22d with different frequencies. Alternatively, or in addition to individual mechanical resonance frequencies that may be used for a respective resonant operation, for operating different valve structures at different frequencies, a non-resonant operation may be implemented in MEMS devices described herein. For example, a non-resonant operation mode may comprise a control to obtain snapping, an electro-mechanical pull-in or the like.

Figure 11:
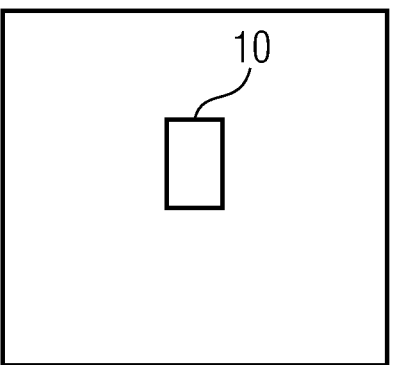
FIG. 11 shows a schematic block diagram of an apparatus according to an embodiment.

FIG. 11 shows a schematic block diagram of an apparatus 120 according to an embodiment. Apparatus 120 may comprise MEMS device 10 and/or a different MEMS device described herein and may implement, for example, a loud-speaker, e.g., as a part of an earphone and/or may implement a pump device.

Some embodiments in accordance with the present disclosure relate are described in the following:

According to a first aspect, a MEMS device comprises:

a substrate comprising a cavity;

a membrane structure mechanically connected to the substrate and configured for deflecting out-of-plane with regard to a substrate plane and with a frequency in an ultrasonic frequency range to cause a motion of a fluid in the cavity;

a valve structure sandwiching the cavity together with the membrane structure;

wherein the valve structure comprises a planar perforated structure;

wherein the valve structure comprises a shutter structure opposing the perforated structure and arranged movably and with a resonance frequency in the ultrasonic frequency range and in-plane with regard to the substrate plane and between a first position and a second position;

wherein the shutter structure is arranged to provide a first fluidic resistance for the fluid in the first position and a second, higher fluidic resistance for the fluid in the second position.

According to a second aspect referring to the first aspect, the MEMS comprises control circuitry configured for controlling a deflection of the membrane structure to deflect with a first ultrasonic frequency; and for controlling an actuator structure coupled to the shutter structure to change between the first position and the second position with a same or different second ultrasonic frequency and to generate a sound pressure level in a front volume of the MEMS device in an audio frequency range from the first ultrasonic frequency.

According to a third aspect referring to the second aspect, the control circuitry is configured for controlling the actuator structure to move the shutter structure into one of the first position and the second position or to move the structure seamlessly, namely into one of a plurality of positions, between the first position and the second position at an instance of time based on a deflection state of the membrane structure at the instance of time.

According to a fourth aspect referring to aspect 2 or 3, the membrane structure is arranged at a first side of the valve structure; wherein a front volume of the MEMS device is arranged at an opposing second side of the valve structure; wherein the control circuitry is configured for controlling the actuator structure and the membrane structure for aggregating a fluidic pressure of the fluid motion generated by the membrane structure in the front volume by use of the valve structure.

According to a seventh aspect referring to one of aspects 2 to 4, the MEMS device comprises a plurality of valve structures sandwiching the cavity together with the membrane structure, wherein the control circuitry is configured for controlling the membrane structure and for individually controlling the plurality of valve structures of the MEMS device, for providing different spectra of the fluidic motion from the cavity with the plurality of valve structures.

According to a sixth aspect referring to one of previous aspects, the MEMS device comprises a spring structure elastically hinging the shutter structure in a rest position; and comprising an actuator structure configured for deflecting the shutter structure in-plane along a direction of movement and out of the rest position.

According to a seventh aspect referring to aspect 6, the shutter structure and the spring structure form at least a part of a resonator having a resonance frequency in the ultrasonic frequency range.

According to an eight aspect referring to aspect 6 or 7, the spring structure comprises an out-of-plane mechanical stiffness being larger when compared to an in-plane mechanical stiffness along the direction of movement.

According to a ninth aspect referring to one of previous aspects, the membrane structure comprises a plurality of ventilation holes configured for a passage of the fluid into the cavity while preventing an acoustic short circuit.

According to a tenth aspect referring to one of previous aspects, a sealing structure is arranged between the perforated structure and the shutter structure, wherein, in a closed state of the valve structure the sealing structure is configured for obstructing a fluid flow through a gap between the perforated structure and the shutter structure.

According to an eleventh aspect referring to one of previous aspects, the MEMS device comprises anti-stiction bumps between the perforated structure and the shutter structure and comprising a sealing structure between the perforated structure and the shutter structure, wherein a remaining gap in an area of the sealing structure is larger when compared to a gap in an area of the anti-stiction bumps.

According to a twelfth aspect referring to one of previous aspects, the perforated structure comprises a mechanical stiffening, the mechanical stiffening configured for suppressing an out-of-plane deflection of the perforated structure; and/or
wherein the shutter structure comprises a mechanical stiffening, the mechanical stiffening configured for suppressing an out-of-plane deflection of the shutter structure.

According to a thirteenth aspect referring to one of previous aspects, the cavity is one of a plurality of cavities being adjacently arranged; wherein each of the plurality of cavities is sandwiched between the membrane structure and a dedicated valve structure of the value structure.

According to a fourteenth aspect referring to one of previous aspects, the shutter structure comprises a lattice structure comprising at least one bar that, when being projected into a common plane parallel to the substrate plane, overlaps with an opening of a perforation of the perforated structure in the second position and reveals at least a part of the opening in the first position when being projected into the common plane.

According to a fifteenth aspect referring one of previous aspects, the MEMS device comprises a protective structure transparent for a sound pressure level of the fluid and arranged to sandwich the valve structure together with the membrane structure, the protective structure configured for mechanically protecting the valve structure.

According to a sixteenth aspect an apparatus comprises a MEMS device of one of previous aspects and is a loudspeaker, e.g., as a part of a wearable such as an earphone, or a pump.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A MEMS device comprising:
a substrate comprising a cavity;
a membrane structure mechanically connected to the substrate and configured for deflecting out-of-plane with regard to a substrate plane and with a frequency in an ultrasonic frequency range to cause a motion of a fluid in the cavity;
a valve structure sandwiching the cavity together with the membrane structure,
wherein the valve structure comprises a planar perforated structure,
wherein the valve structure comprises a shutter structure opposing the planar perforated structure and arranged moveably and with a resonance frequency in the ultrasonic frequency range and in-plane with regard to the substrate plane between a first position and a second position,
wherein the shutter structure is arranged to provide a first fluidic resistance for the fluid in the first position and a second, higher fluidic resistance for the fluid in the second position; and
control circuitry configured for controlling a deflection of the membrane structure to deflect with a first ultrasonic frequency; and for controlling an actuator structure coupled to the shutter structure to change between the first position and the second position with a same or different second ultrasonic frequency and to generate, from the first ultrasonic frequency, a sound pressure level in a front volume of the MEMS device in an audio frequency range,
wherein the valve structure comprises a plurality of valve structures sandwiching the cavity together with the membrane structure, wherein the control circuitry is configured for controlling the membrane structure and for individually controlling each of the plurality of valve structures of the MEMS device with an individual control signal, for providing different spectra of fluidic motion from the cavity with the plurality of valve structures, and wherein the plurality of valve structures comprises at least three valve structures.

2. The MEMS device of claim 1, wherein the control circuitry is configured for controlling the actuator structure to move the shutter structure into one of the first position and the second position or to move the shutter structure into one of a plurality of positions between the first position and the second position at an instance of time based on a deflection state of the membrane structure at the instance of time.

3. The MEMS device of claim 1, wherein the membrane structure is arranged at a first side of the valve structure; wherein a front volume of the MEMS device is arranged at an opposing second side of the valve structure; wherein the control circuitry is configured for controlling the actuator structure and the membrane structure for aggregating a fluidic pressure of fluid motion generated by the membrane structure in the front volume by use of the valve structure.

4. The MEMS device of claim 1, comprising a spring structure elastically hinging the shutter structure in a rest position; and comprising an actuator structure configured for deflecting the shutter structure in-plane along a direction of movement and out of the rest position.

5. The MEMS device of claim 4, wherein the shutter structure and the spring structure form at least a part of a resonator having a resonance frequency in the ultrasonic frequency range.

6. The MEMS device of claim 5, wherein the spring structure comprises an out- of-plane mechanical stiffness being larger when compared to an in-plane mechanical stiffness along the direction of movement.

7. The MEMS device of claim 1, wherein the membrane structure comprises a plurality of ventilation holes configured for a passage of the fluid into the cavity while preventing an acoustic short circuit.

8. The MEMS device of claim 1, comprising a sealing structure between the planar perforated structure and the shutter structure, wherein, in a closed state of the valve structure the sealing structure is configured for obstructing a fluid flow through a gap between the planar perforated structure and the shutter structure.

9. The MEMS device of claim 1, comprising anti-stiction bumps between the planar perforated structure and the shutter structure and comprising a sealing structure between the planar perforated structure and the shutter structure, wherein a remaining gap in an area of the sealing structure is larger when compared to a gap in an area of the anti-stiction bumps.

10. The MEMS device of claim 1, wherein at least one of:
the planar perforated structure comprises a mechanical stiffening, the mechanical stiffening configured for suppressing an out-of-plane deflection of the planar perforated structure; or
the shutter structure comprises a mechanical stiffening, the mechanical stiffening configured for suppressing an out-of-plane deflection of the shutter structure.

11. The MEMS device of claim 1, wherein the cavity is one of a plurality of cavities being adjacently arranged; wherein each of the plurality of cavities is sandwiched between the membrane structure and a dedicated valve structure of the valve structure.

12. The MEMS device of claim 1, wherein the shutter structure comprises a lattice structure comprising at least one bar that, when being projected into a common plane parallel to the substrate plane, overlaps with an opening of a perforation of the planar perforated structure in the second position and reveals at least a part of the opening in the first position when being projected into the common plane.

13. The MEMS device of claim 1, comprising a protective structure transparent for a sound pressure level of the fluid and arranged to sandwich the valve structure together with the membrane structure, the protective structure configured for mechanically protecting the valve structure.

14. An apparatus comprising:
a protective structure; and a MEMS device comprising:
a substrate comprising a cavity;
a membrane structure mechanically connected to the substrate and configured for deflecting out-of-plane with regard to a substrate plane and with a frequency in an ultrasonic frequency range to cause a motion of a fluid in the cavity;
a valve structure sandwiching the cavity together with the membrane structure, and the protective structure and membrane structure sandwiching the valve structure;
wherein the valve structure comprises a planar perforated structure;
wherein the valve structure comprises a shutter structure opposing the planar perforated structure and arranged moveably and with a resonance frequency in the ultrasonic frequency range and in-plane with regard to the substrate plane between a first position and a second position;
wherein the shutter structure is arranged to provide a first fluidic resistance for the fluid in the first position and a second, higher fluidic resistance for the fluid in the second position; and
wherein the valve structure comprises a plurality of valve structures, and wherein each of the plurality of valve structures comprise individually controlled valve structures that are controlled by an individual control signal, and wherein the plurality of valve structures comprises at least three valve structures.

15. The apparatus of claim 14, wherein the MEMS device comprises one of a loudspeaker and a pump.

16. A MEMS device comprising:
a substrate including a cavity;
a membrane structure mechanically connected to the substrate and configured to deflect out-of-plane with regard to a substrate plane and with a frequency in an ultrasonic frequency range; and
a valve structure, the valve structure and the membrane structure sandwiching the cavity and the valve structure including:
a planar perforated structure; and
a shutter structure opposing the planar perforated structure and arranged moveably and with a frequency in the ultrasonic frequency range and in-plane relative to the substrate plane between a first position and a second position,
wherein the valve structure comprises a plurality of valve structures, and wherein each of the plurality of valve structures comprise individually controlled valve structures that are controlled with an individual control signal, and wherein the plurality of valve structures comprises at least three valve structures.

17. The MEMS device of claim 16, comprising control circuitry to control a deflection of the membrane structure to deflect with a first ultrasonic frequency and to control an actuator structure coupled to each shutter structure to change between the first position and the second position at the first ultrasonic frequency or at a different second ultrasonic frequency.

18. The MEMS device of claim 16, wherein the frequency of each shutter structure in the ultrasonic frequency range is a resonant frequency of the shutter structure.

19. The MEMS device of claim 1, wherein the plurality of valve structures is arranged in a quadratic two-dimensional array.

20. The MEMS device of claim 19, wherein at a first time instance, a first number of valve structures of the plurality of valve structures is active, wherein at a second time instance, a second number of valve structures of the plurality of valve structures is active, and wherein the range of the first number and second number is between one and a total number of valve structures in the plurality of valve structures.

* * * * *